United States Patent [19]

Tanaka et al.

[11] Patent Number: 5,331,181
[45] Date of Patent: Jul. 19, 1994

[54] NON-VOLATILE SEMICONDUCTOR MEMORY

[75] Inventors: Kenichi Tanaka, Nara; Yoshimitsu Yamauchi, Yamatokoriyama; Keizo Sakiyama, Kashihara, all of Japan

[73] Assignee: Sharp Kabushiki Kaisha, Osaka, Japan

[21] Appl. No.: 82,511

[22] Filed: Jun. 25, 1993

Related U.S. Application Data

[63] Continuation of Ser. No. 735,807, Jul. 25, 1991, abandoned.

[30] Foreign Application Priority Data

Aug. 1, 1990 [JP] Japan .................. 2-206434

[51] Int. Cl.$^5$ ............... H01L 29/00; H01L 29/34; H01L 27/02; H01L 29/68
[52] U.S. Cl. ........................ 257/23; 257/322; 257/324; 257/325; 257/395; 257/411; 257/530; 257/635; 257/637; 257/638; 257/640
[58] Field of Search .............. 357/23.5, 23.4; 365/184; 257/322, 365, 324, 325, 411, 395, 530, 23, 635, 637, 638

[56] References Cited

U.S. PATENT DOCUMENTS

| | | | |
|---|---|---|---|
| 4,016,588 | 4/1977 | Ohya et al. | 357/23 |
| 4,112,507 | 9/1978 | White et al. | 365/184 |
| 4,151,537 | 4/1979 | Goldman et al. | 257/324 |
| 4,808,261 | 2/1989 | Ghidini et al. | 257/411 |
| 4,899,205 | 2/1990 | Hamdy et al. | 257/530 |
| 4,996,572 | 2/1991 | Tanaka et al. | 357/23.5 |
| 5,063,423 | 11/1991 | Fujii et al. | 357/23.5 |
| 5,134,457 | 7/1992 | Hamdy et al. | 257/530 |
| 5,138,410 | 8/1992 | Takebuchi | 357/23.5 |

FOREIGN PATENT DOCUMENTS 58 9295 4/1983 Japan .
63 15458 6/1988 Japan .

*Primary Examiner*—Sara W. Crane
*Assistant Examiner*—T. M. Arroyo
*Attorney, Agent, or Firm*—Nixon & Vanderhye

[57] ABSTRACT

A non-volatile semiconductor memory providing a semiconductor substrate including source and drain diffusion regions and a gate electrode, and an insulating film which is at least provided on the semiconductor substrate just below the gate electrode and has a smaller dielectric breakdown strength on the source side than on the drain side, wherein the insulating film is comprised of a laminated film having a multilayer structure on the drain side and a single-layer film or multilayer film which is broken down at a smaller voltage on the source side than on the drain side, and a predetermined voltage is applied to break down the single-layer film or multilayer film on the source side, so that data can electrically be written only once.

6 Claims, 2 Drawing Sheets

NON-VOLATILE SEMICONDUCTOR MEMORY

This is a continuation of application Ser. No. 07/735,807, filed Jul. 25, 1991, now abandoned.

BACKGROUND OF THE INVENTION

1. Field of the Invention

The present invention relates to a non-volatile semiconductor memory capable of electrically writing data.

2. Description of the Prior Art

Conventionally, there has been used a ultraviolet erasure type EPROM capable of electrically writing data only once.

Furthermore, there has also been used a breakdown of insulator for conduction type memory capable of performing programming by breaking down an insulating film having a three-layer structure of $SiO_2$—$SiN$—$SiO_2$ [IEICE Technical Report, Vol. 89, No. 66, SDM89-15 (IEICE=The Institute of Electronics, Information and Communication Engineers)].

Referring to the ultraviolet erasure type EPROM, a two-layer gate structure is needed so that a manufacturing method is complicated. In addition, there is a possibility that the data stored in a floating gate flows out during continuous use so as to be lost.

Referring to the breakdown of insulator for conduction type memory, it is necessary to separate a program region from a gate region. Consequently, it is difficult to reduce the element dimension.

It is an object of the present invention to provide a breakdown of insulator for conduction type non-volatile semiconductor memory capable of electrically writing data only once after manufacturing a LSI wherein the element dimension can be reduced and a charge does not flow out.

SUMMARY OF THE INVENTION

The present invention provides a non-volatile semiconductor memory comprising a semiconductor substrate including source and drain diffusion regions and a gate electrode, and an insulating film which is at least provided on the semiconductor substrate just below the gate electrode and has a smaller dielectric breakdown strength on the source side than on the drain side, wherein the insulating film is comprised of a laminated film having a multilayer structure on the drain side and a single-layer film or multilayer film which is broken down at a smaller voltage on the source side than on the drain side, and a predetermined voltage is applied to break down the single-layer film or multilayer film on the source side, so that data can electrically be written only once.

DETAILED DESCRIPTION OF A PREFERRED EMBODIMENT

A breakdown of insulator for conduction type memory according to the present invention is characterized in that an insulating film portion to be broken down for writing is provided on the source side just below a gate electrode. Consequently, the size of a memory cell can be reduced.

Figure 1:
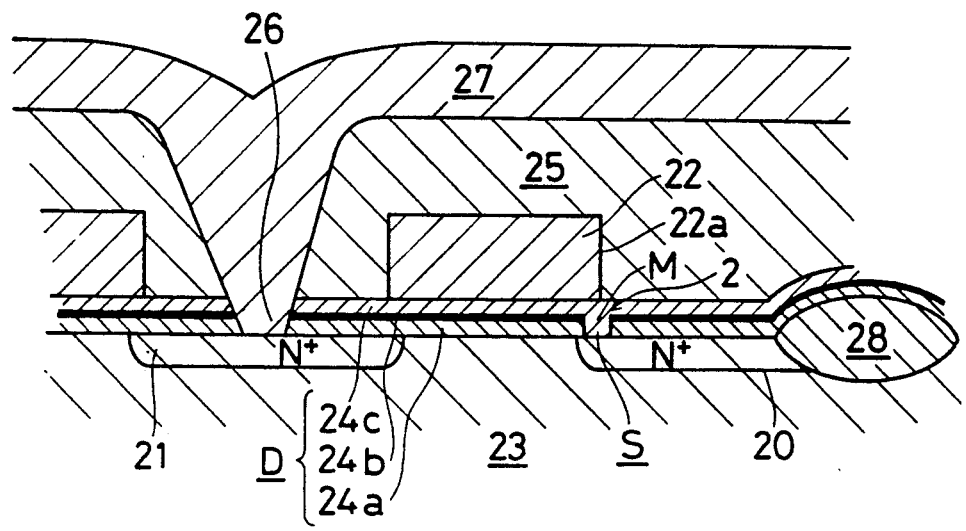
FIG. 1 is a diagram for explaining a structure according to an embodiment of the present invention.

It is a main object of the present invention to easily break down a gate insulating film, which is provided just below the gate electrode of a transistor, only in a source portion. Thus, the insulating film portions have different structures on drain and source sides, respectively. As shown in FIG. 1, a laminated film portion D on the drain side has a three-layer structure of $SiO_2$—$SiN$—$SiO_2$, and an insulating film region S on the source side is a $SiO_2$ film. Thus, the gate insulating film is provided just below the gate electrode so that the $SiO_2$ film as the insulating film on the source side can be broken down.

The $SiO_2$ film as the insulating film on the source side may comprise (a) a thermal oxide film and a CVD oxide film which are sequentially laminated, or (b) only the CVD oxide film.

In that case, a $SiO_2$ film having a resisting pressure of 10 MV/cm is used for the thermal oxide film, and a $SiO_2$ film having a resisting pressure of 8 MV/cm is used for the CVD oxide film.

The combination of the drain and source portions D and S is not limited to the foregoing. If a breakdown voltage BV has the relationship of $BVd > BVs$, any material and thickness can be selected.

Referring to an embodiment of the present invention shown in FIG. 1, (1) A $SiO_2$ thermal oxide film—SiN film—$SiO_2$ thermal oxide film as a laminated film mainly covers the drain portion below the gate electrode and is broken down at a high voltage. In the case where the SiN film is converted into the $SiO_2$ thermal oxide film so that the laminated film has a thickness of 200 Å, the laminated film is not broken down even if a voltage of 30 V is applied.

(2) On the other hand, a $SiO_2$ film 2, which is formed in the source portion below the gate electrode and has a thickness of 200 Å, is broken down if a voltage of 20 V is applied.

(3) Accordingly, the insulating film 2 on the source side can selectively be broken down.

A preferred embodiment of the present invention will be described in more detail with reference to the drawings. The present invention is not limited to the following embodiment.

In FIG. 1, a non-volatile semiconductor memory comprises a P-type Si substrate 23 and a $SiO_2$ insulating film 2. The P-type Si substrate 23 includes source and drain N+ diffusion regions 20 and 21, and a gate electrode 22. The $SiO_2$ insulating film 2 is provided on the Si substrate 23 just below the gate electrode 22 and has a smaller dielectric breakdown strength in an insulating film region S on the source side than that of a laminated film portion D on the drain side.

A laminated film is comprised of a multilayer film D having a $SiO_2$ thermal oxide film 24a (having a thickness of 10 to 15 Å)-Sin film 24b (having a thickness of 40 to 70 Å)-$SiO_2$ thermal oxide film 24c (having a thickness of 10 to 15 Å) in the drain portion, and the insulating film region S of the SiO₂ film 2 in the source portion. The insulating film region S of the SiO₂ film 2 is formed by a CVD method and is broken down at a smaller voltage than in the drain portion. A SiO₂ layer insulation film is indicated at 25. A contact hole is indicated at 26. An Al wiring (a bit line) is indicated at 27. A SiO₂ LOCOS film is indicated at 28.

A manufacturing method will be described below.

First, the SiO₂ LOCOS film 28 is formed on the P-type Si substrate 23 by a LOCOS method. Then, $^{11}$B+ ions are implanted in the substrate 23 at a density of $10^{12}/cm^2$ so as to control the surface density. Consequently, a threshold voltage Vth of the gate electrode 22 to be formed is controlled.

Thereafter, thermal oxidation is carried out on the whole surface by a known method so as to form a SiO₂ thermal oxide film having a thickness of about 10 to 15 Å. The SiO₂ thermal oxide film, which is provided just below the gate electrode to be formed, is the lowest film 24a of the laminated film in the drain portion D.

Subsequently, the SiN film (silicon nitride film) 24b having a thickness of about 40 to 70 Å is laminated over the SiO₂ film 24a by the CVD method. Then, the surface of the SiN film 24b is thermally oxidized to form the SiO₂ thermal oxide film 24c having a thickness of about 10 to 15 Å. The films 24b and 24c are also formed over the Si substrate 23 including the region just below the gate electrode.

Then, a phosphorus-doped polycrystalline silicon film is laminated on the whole surface at a thickness of about 1500 to 2500 Å.

A tungsten silicide film is laminated on the phosphorus-doped polycrystalline silicon film at a thickness of about 1500 to 2500 Å in order to reduce the resistance of the polycrystalline silicon film.

Subsequently, a photoresist layer for forming the gate electrode is laminated to prepare a resist pattern. Then, etching is carried out to form the gate electrode 22 having a tungsten silicide film and a phosphorus-doped polysilicon film on the upper and lower layers.

Thereafter, the SiO₂ film 24c, SiN film 24b and SiO₂ film 24a on the source side are removed by a known etching method with the use of a mask having an opening on a source side end 22a of the gate electrode 22 and in the vicinity thereof. In this case, it is preferred that the SiN film and the upper SiO₂ film are simultaneously removed on the source side just below the gate electrode 22.

As shown in FIG. 1, there is formed an M region in which the SiN film 24b is not provided just below the gate electrode 22. The region M is filled in with SiO₂ in the next step by the known CVD method. When the region M is filled in with the SiO₂, a predetermined thermal treatment is carried out. Finally, the source/-drain diffusion layers 20 and 21 are formed to laminate the SiO₂ layer insulation film 25 thereon. Then, the contact hole 26 is formed. The Al layer 27 is laminated on the whole surface including the contact hole 26. A protective layer (not shown) is formed on the Al layer 27. Thus, a memory is obtained.

Figure 2A:
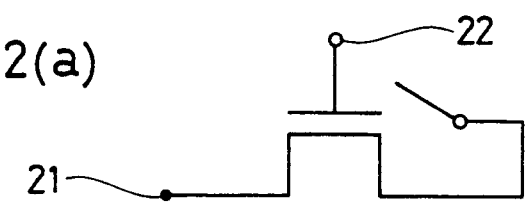
FIGS. 2 (a) and (b) are equivalent circuit diagrams showing one of memories and the combination thereof according to the embodiment of the present invention, respectively.
Figure 2B:
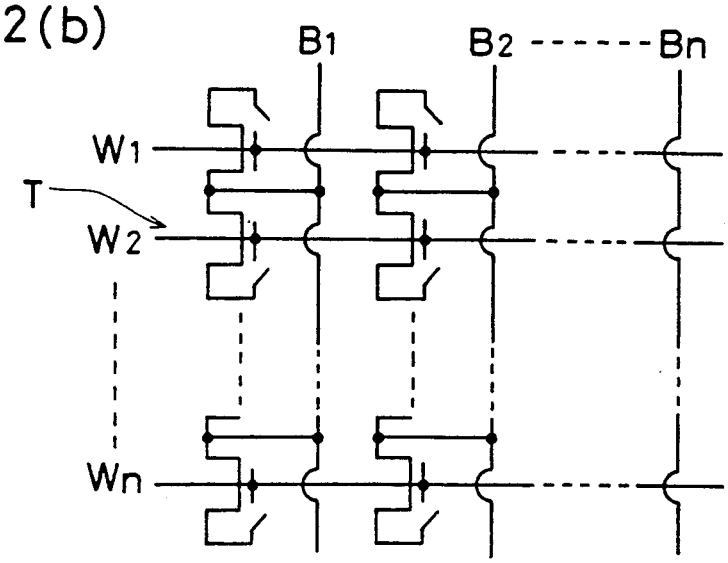

The operation will be described with reference to FIGS. 2(a) and 2(b). FIG. 2(a) shows N bit lines (B1, B2, . . . BN) and N word lines (W1, W2, . . . WN).

As shown in FIG. 2 (b), the procedure for writing is as follows.

(1) A voltage of 10 V is applied to all the bit lines B1 to BN and word lines W1 to WN.

(2) The bit line B1 is set to 0 V and the word line W2 is set to 20 V, while others keep 10 V.

Figure 3:
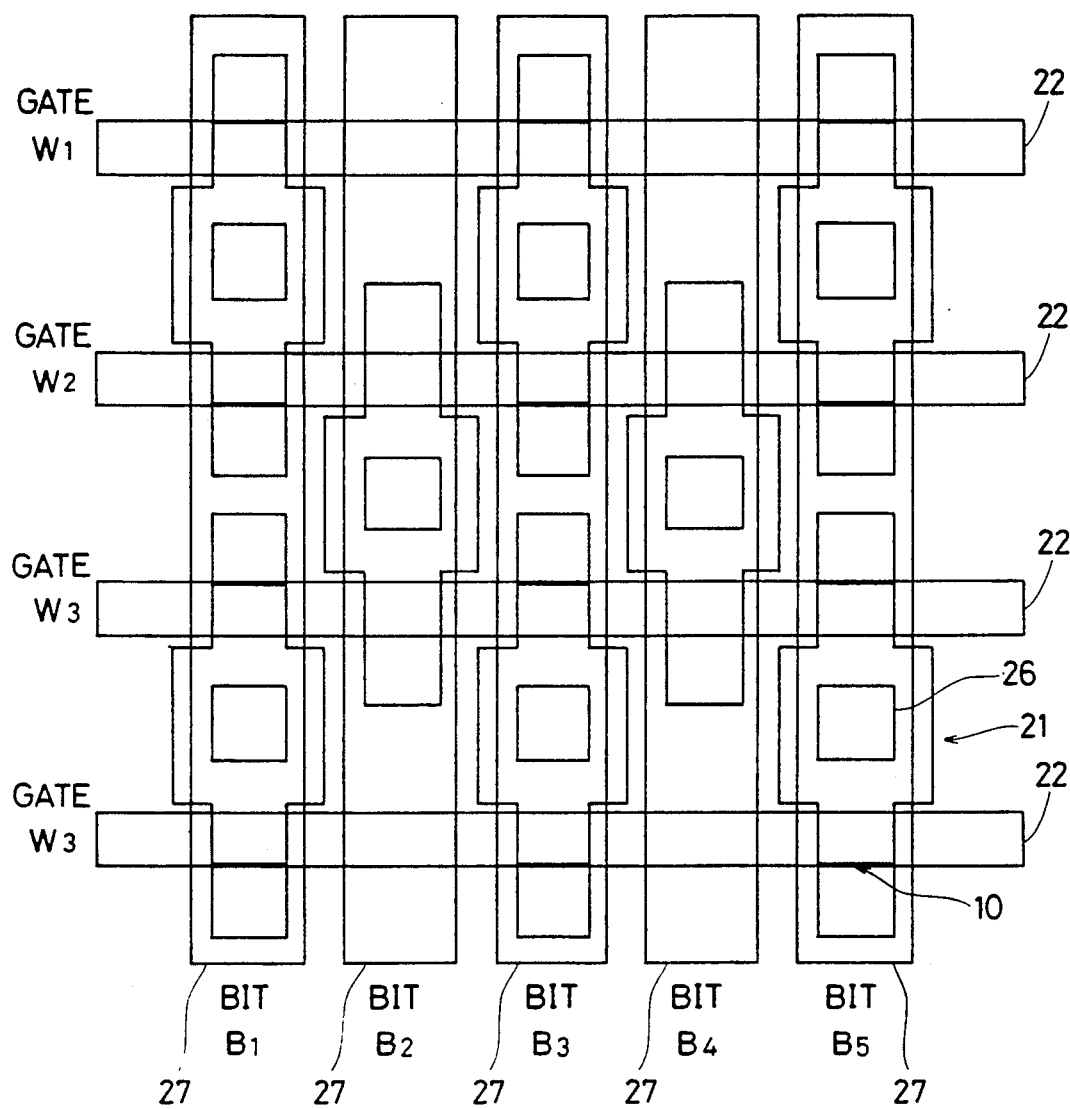
FIG. 3 is a diagram for explaining the writing state of the memory according to the embodiment of the present invention.

(3) A potential difference of 20 V is made between a gate electrode and a source of a transistor T which is selected by the bit line B1 and word line W2. Consequently, the source is broken down so that the gate electrode and the source are made conductive. Thus, information is electrically programmed in a portion indicated at 10 in FIG. 3. Other transistors keep a potential difference of 10 V so as not to be broken down.

(4) The bit line B1 and the word line W2 are set to 10 V so as to write the information in the next transistor.

Thus, the information can be written in any transistor.

When a read voltage (for example, 5 V) is applied to any (WI) of the word lines W1 to WN, it is outputted to only the bit line of the transistor which is connected to the word line WI and has an insulating film on the source side broken down. Consequently, the written data can be read out.

In the case where a laminated film on the drain side is a thermal oxide film and has a resisting pressure of 10 MV/cm, and an insulating film on the source side is a CVD oxide film, the procedure for writing is the same as in the above-mentioned embodiment. In addition, it is necessary to set an applied voltage to 9 V in a step (1) and to 0 V and 18 V in a step (2).

According to the present invention, a breakdown portion of a breakdown of insulator for conduction type memory is provided on the source side. Consequently, the size of the memory cell can be reduced.

What is claimed is:

1. A non-volatile semiconductor memory comprising:
   a semiconductor substrate including source and drain diffusion regions and a gate electrode, and
   an insulating film which is at least provided on the semiconductor substrate just below the gate electrode and has a portion over the source diffusion region and adjacent to an edge of the gate electrode having a dielectric breakdown strength smaller than a remaining portion of said film,
   wherein the insulating film is comprised of a laminated film having a multilayer structure on the drain side and at least a single-layer film on the source side which is broken down at a smaller voltage than said laminated film on the drain side, and a permanent conductive path between said gate electrode and said source diffusion region formed when a predetermined voltage is applied to break down said at least single-layer film on the source side, so that data can electrically be written only once.

2. A non-volatile semiconductor memory according to claim 1, wherein the at least single-layer film on the source side is a CVDSiO₂ film, and the laminated film on the drain side is an insulating film which is formed by sequentially laminating a SiO₂ thermal oxide film, a SiN film and a SiO₂ thermal oxide film.

3. A non-volatile semiconductor memory according to claim 1, wherein said at least single-layer film on the source side is a laminated insulating film including a SiO₂ thermal oxide film and a CVDSiO₂ film, and the laminated film on the drain side is an insulating film including a SiO₂ thermal oxide film, a SiN film and a SiO₂ thermal oxide film.

4. A non-volatile semiconductor memory comprising:
   a semiconductor substrate including source and drain diffusion regions, a gate electrode on the semiconductor substrate between a source and a drain region and overlying at least a part of the source diffusion region, and an insulating film between the gate electrode and the semiconductor substrate, said film having a breakdown region at least partially below said gate electrode and partially above said source region, said breakdown region having a dielectric breakdown strength weaker than a dielectric breakdown strength of said film in a region between said gate electrode and said drain region, wherein a conductive path between said gate electrode and said source diffusion means is established when a permanent conductive path between said gate electrode and said source diffusion region is established when a predetermined voltage is applied to the gate electrode dielectrically to break down the insulating film on the source side, so that data can electrically be written only once.

5. A non-volatile semiconductor memory according to claim 4, wherein the insulating film comprises a single-layer film covering the source portion and a multi-layer film covering the substrate between the source and drain regions but does not overly the source portion.

6. A non-volatile semiconductor memory according to claim 5, wherein said single-layer film on the source side is a $CVDSiO_2$ thermal oxide film.

* * * * *